United States Patent
Hagen

(10) Patent No.: US 10,826,440 B2
(45) Date of Patent: Nov. 3, 2020

(54) EXTENDED OPERATIONAL BANDWIDTH AMPLIFIERS WITH FRACTIONAL INSTANTANEOUS BANDWIDTH FEED FORWARD CORRECTION

(71) Applicant: MOTOROLA SOLUTIONS, INC., Chicago, IL (US)

(72) Inventor: Rodney W. Hagen, Lake In The Hills, IL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 48 days.

(21) Appl. No.: 16/235,386

(22) Filed: Dec. 28, 2018

(65) Prior Publication Data

US 2020/0212851 A1    Jul. 2, 2020

(51) Int. Cl.
| | |
|---|---|
| *H03F 1/00* | (2006.01) |
| *H03F 1/32* | (2006.01) |
| *H03F 1/42* | (2006.01) |
| *H03F 1/26* | (2006.01) |

(52) U.S. Cl.
CPC ............ *H03F 1/3229* (2013.01); *H03F 1/26* (2013.01); *H03F 1/42* (2013.01); *H03F 1/00* (2013.01)

(58) Field of Classification Search
CPC . H03F 1/3229; H03F 1/42; H03F 1/26; H03F 1/3223; H03F 1/3211; H03F 1/3235; H03F 2201/3212; H03F 3/45547; H03F 3/45596; H03F 2201/3218
USPC .................................. 330/149, 151
See application file for complete search history.

(56) References Cited

U.S. PATENT DOCUMENTS

| | | | |
|---|---|---|---|
| 5,334,946 A | 8/1994 | Kenington et al. | |
| 5,489,875 A * | 2/1996 | Cavers | H03F 1/3229 330/149 |
| 5,491,454 A * | 2/1996 | Matz | H03F 1/3229 330/149 |
| 5,594,385 A * | 1/1997 | Anvari | H03F 1/3235 330/149 |

(Continued)

FOREIGN PATENT DOCUMENTS

WO    2007106337 A2    9/2007

OTHER PUBLICATIONS

Examination Report No. 1 issued by the Australian Government for Application No. 2019275570 dated Aug. 10, 2020 (4 pages).

(Continued)

*Primary Examiner* — Khanh V Nguyen
(74) *Attorney, Agent, or Firm* — Michael Best and Friedrich LLP

(57) ABSTRACT

Apparatus and method for extended operational bandwidth amplifiers with fractional instantaneous bandwidth feed forward correction. In one embodiment, the method includes amplifying a radio frequency (RF) input signal to provide an amplified RF signal and introducing a first delay in the amplified RF signal. The method also includes receiving an error signal of the amplified RF signal and centering a correction bandwidth with respect to the amplified RF signal. The method also includes amplifying the error signal and combining the amplified RF signal and the amplified error signal to reduce an error in the amplified RF signal. The first delay is smaller than a second delay caused by the error path.

14 Claims, 5 Drawing Sheets

(56) References Cited

U.S. PATENT DOCUMENTS

| | | | | |
|---|---|---|---|---|
| 6,011,434 | A * | 1/2000 | Sakai | H03F 1/3241 |
| | | | | 330/151 |
| 6,104,241 | A * | 8/2000 | Cova | H03F 1/32 |
| | | | | 330/149 |
| 6,144,255 | A * | 11/2000 | Patel | H03F 1/3229 |
| | | | | 330/149 |
| 6,275,106 | B1 * | 8/2001 | Gomez | H03F 1/3229 |
| | | | | 330/149 |
| 6,493,543 | B1 * | 12/2002 | Shin | H03F 1/3229 |
| | | | | 327/359 |
| 6,885,242 | B2 * | 4/2005 | Leffel | H03F 1/3229 |
| | | | | 330/149 |
| 7,126,418 | B2 | 10/2006 | Hunton et al. | |
| 7,167,693 | B2 * | 1/2007 | Bachman, II | H03F 1/3229 |
| | | | | 330/151 |
| 7,679,440 | B2 * | 3/2010 | Ishigami | H03F 1/3229 |
| | | | | 330/149 |
| 2004/0124920 | A1 | 7/2004 | Hunton et al. | |
| 2004/0160274 | A1 | 8/2004 | Gurvich et al. | |

OTHER PUBLICATIONS

Search Report issued by the United Kingdom Intellectual Property Office for Application No. 1917550.4 dated May 22, 2020 (6 pages).

\* cited by examiner

EXTENDED OPERATIONAL BANDWIDTH AMPLIFIERS WITH FRACTIONAL INSTANTANEOUS BANDWIDTH FEED FORWARD CORRECTION

BACKGROUND OF THE INVENTION

Radio-frequency (RF) signals are transmitted by modulating a carrier wave to encode information into the carrier wave. Radio-frequency (RF) transmitters typically use a single carrier wave having specific carrier attributes, for example, bandwidth, frequency, power level, and the like. RF signals are passed through a power amplifier to amplify the signals before transmission. Power amplifiers, however, may introduce distortion into the amplified signal that may interfere with other channels on the network.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
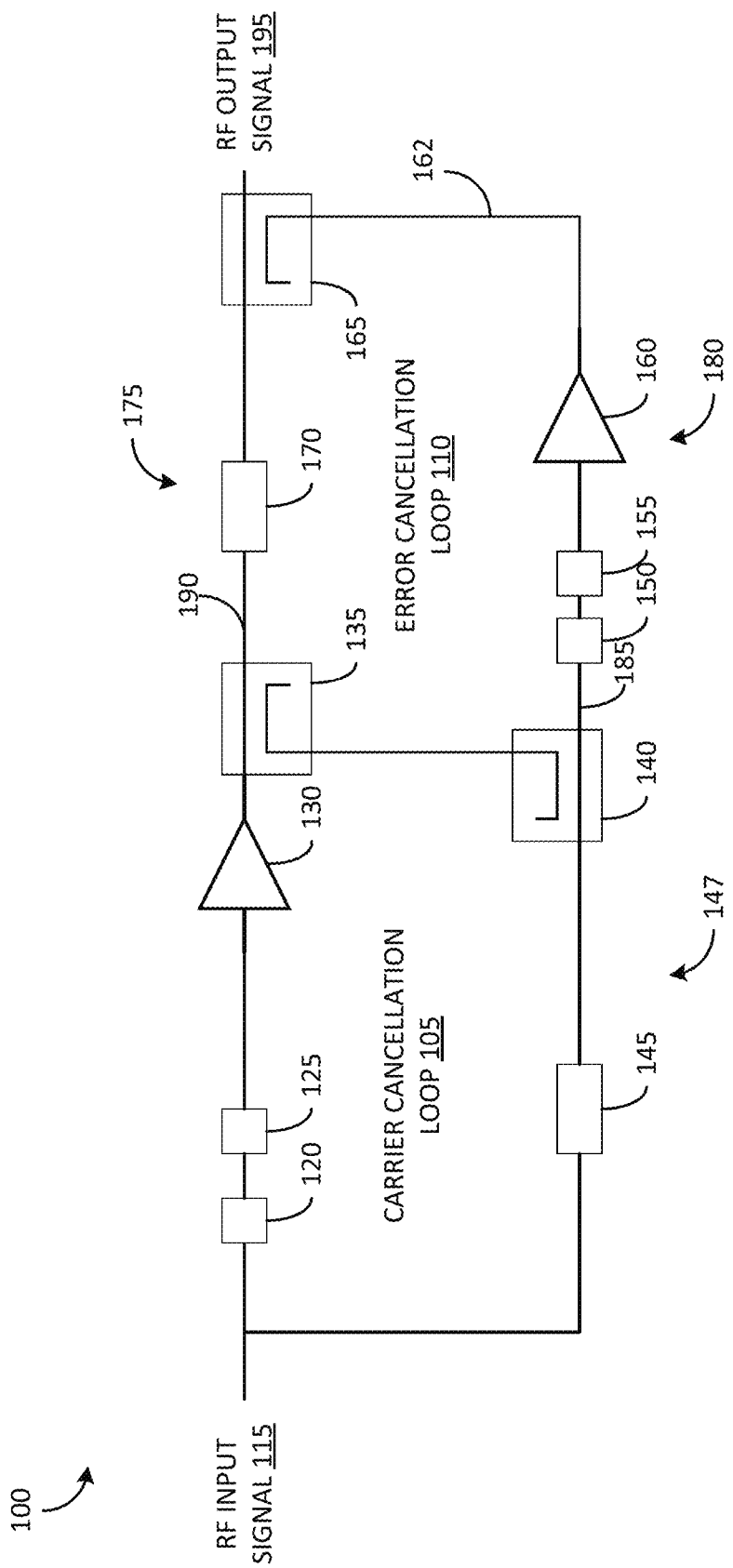
FIG. 1 is a simplified block diagram of a power amplifier in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As noted above, power amplifiers are used in RF communication systems. To reduce the distortion introduced by the power amplifier, feed forward error correction is sometimes used to cancel intermodulation effects.

FIG. 1 is a simplified block diagram of a prior art power amplifier 100. The power amplifier 100 includes a carrier cancellation loop 105 and an error cancellation loop 110. The carrier cancellation loop 105 includes a radio frequency (RF) input signal 115, a carrier cancellation phase shifter 120, a carrier cancellation gain shifter 125, a main amplifier 130, a main path carrier cancellation coupler 135, a clean path carrier cancellation coupler 140, and a carrier cancellation delay 145. The error cancellation loop 110 includes the main path carrier cancellation coupler 135, the clean path carrier cancellation coupler 140, an error cancellation phase shifter 150, an error cancellation gain shifter 155, an error amplifier 160, an error cancellation coupler 165, and an error cancellation delay 170.

The main amplifier 130 receives RF input signal 115 and generates an amplified main path signal 190 in an amplified main path 175 of the power amplifier 100. The phase and gain of the RF input signal 115 can be adjusted using the carrier cancellation phase shifter 120 and the carrier cancellation gain shifter 125 respectively. The amplified main path signal 190 includes distortion components (for example, $3^{rd}$ order intermodulation components, $5^{th}$ order intermodulation components, and so on) that may interfere with other radio frequencies. The feed forward correction realized by proper alignment of the carrier cancellation loop 105 and the error cancellation loop 110 reduces the distortion components in an amplified radio frequency (RF) output signal 195 to reduce interference on neighboring radio frequency channels.

The clean path carrier cancellation coupler 140 receives the RF input signal 115 and the amplified main path signal 190 from the main path carrier cancellation coupler 135. The clean path carrier cancellation coupler 140 cancels or reduces the carrier signal from the amplified main path signal 190 and provides an error signal 185 including the distortion components with reduced carrier signal component on an error path 180 to the error amplifier 160. The carrier cancellation delay 145 is provided in a clean path 147 to match the delay in the amplified main path signal 190 caused by the main amplifier 130. The carrier cancellation delay 145 allows the RF input signal 115 and the amplified main path signal 190 to be provided via the main path carrier cancellation coupler 135 to the clean path carrier cancellation coupler 140 with minimal delay mismatch. In some embodiments, the RF input signal 115 and the amplified main path signal 190 are provided at substantially "180" degrees apart at the clean path carrier cancellation coupler 140.

The error amplifier 160 amplifies the error signal 185 to generate an amplified error signal 162 to the error cancellation coupler 165. The error cancellation coupler 165 couples the amplified error signal 162 out of phase by "180" degrees with the amplified main path signal 190 to cancel or reduce the distortions in the RF output signal 195. The phase and gain of the error signal 185 can be adjusted using the error cancellation phase shifter 150 and the error cancellation gain shifter 155 respectively. The error cancellation delay 170 is provided in the amplified main path 175 to match the delay caused by the error amplifier 160 and other components in the error path 180 (for example, the main path carrier cancellation coupler 135, the clean path carrier cancellation coupler 140, the error cancellation phase shifter 150, and the error cancellation gain shifter 155). The error cancellation delay 170 allows the error signal 185 and the amplified main path signal 190 to be provided to the error cancellation coupler 165 with minimal delay mismatch. In some embodiments, the error signal 185 and the amplified main path signal 190 are provided at substantially "180" degrees apart at the error cancellation coupler 165.

Figure 2:
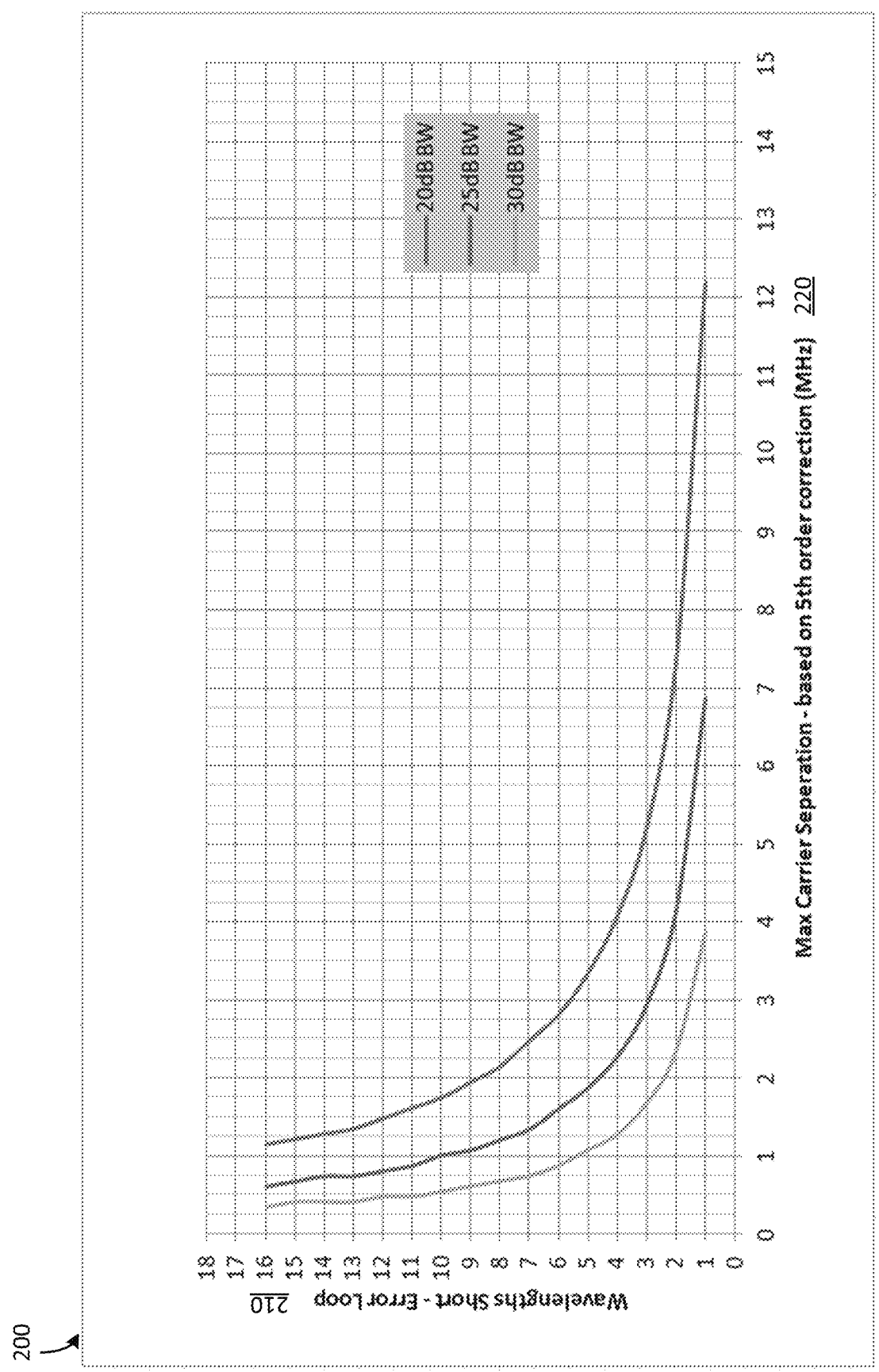
FIG. 2 is a graphical representation illustrating the correlation between a delay mismatch and the instantaneous correction bandwidth of the power amplifier of FIG. 1 in accordance with some embodiments.

The error cancellation delay 170 may be selected to closely match the delay on the error path 180. The closer the error cancellation delay 170 matches the delay on the error path 180, the larger the instantaneous correction bandwidth of the power amplifier 100. FIG. 2 is a graph 200 illustrating an example relationship between delay mismatch between the amplified main path 175 and the error path 180 and the instantaneous correction bandwidth. The graph 200 shows the delay mismatch 210 on the y-axis and the maximum carrier separation 220 on the x-axis. The delay mismatch 210 is represented in terms of wavelengths short—that is, the number of wavelengths the error signal is short when the error signal arrives at the error cancellation coupler 165. The maximum carrier separation 220 is the allowable bandwidth of the RF input signal 115 that still provides desired amount of correction in the RF output signal's 195 $3^{rd}$ and $5^{th}$ order intermodulation distortion products (IMD). The graph 200 includes a first plot for achieving "20" decibels (dB) of correction, a second plot for achieving "25" dB of correction, and a third plot for achieving "30" dB of correction.

As can be seen from the graph 200, the lower the delay mismatch 210 between the amplified main path 175 and the error path 180 the larger the instantaneous correction bandwidth of the RF input signal 115. However, a large error cancellation delay 170 introduces additional attenuation in the amplified main path signal 190. Accordingly, to meet the system requirements, the main amplifier 130 may consume more power or a larger main amplifier 130 may be used to compensate for the attenuation caused by the error cancellation delay 170. Additionally, a larger error amplifier 160 may be used to cancel higher distortion created by the larger main amplifier 130. In either case, the main amplifier 130 and the error amplifier 160 consume more power to reduce additional distortions.

Accordingly, the power amplifiers 100 are designed to intentionally mismatch the delay between the amplified main path 175 and the error path 180 to increase the efficiency of the power amplifier 100. For example, the power amplifiers 100 are designed to provide fractional instantaneous bandwidth feed forward correction. For example, at 50% delay match (that is, at 8 wavelengths short), "20" dB of $3^{rd}$ and $5^{th}$ order IMD correction may still be achieved over a carrier separation of about 2 Mega-Hertz (MHz). Thus, by increasing the delay mismatch, although the efficiency of the power amplifier 100 is increased, the operational bandwidth of the power amplifier 100 is significantly reduced. This sacrifice in operational bandwidth is acceptable in implementations where the RF input signal 115 has a static carrier with minimal separation in carriers.

In Land Mobile Radio (LMR) systems, the carrier attributes of the RF signals are dynamic. For example, the bandwidth, frequency, power level, modulation, number of carriers, and the like are changed according to radio frequency (RF) traffic created by subscriber devices. In the ultra-high frequency (UHF) band, the RF input signal 115 may vary between 380 MHz and 527 MHz. In this situation, an organization implementing the power amplifier 100 may have to stock many models corresponding to the different bandwidths in the UHF land mobile radio band.

Accordingly, there is a need for extending the operational bandwidth of amplifiers with fractional instantaneous bandwidth feed forward correction.

One embodiment provides a power amplifier including a main amplifier amplifying a radio frequency (RF) input signal to provide an amplified radio frequency (RF) signal and a feed forward correction loop coupled to the main amplifier for cancelling intermodulation distortion in the amplified RF signal. The feed forward correction loop includes a delay element in a main path of the feed forward correction loop and an error amplifier in an error path and coupled to the phase shifter. The feed forward correction loop also includes a composite phase shifter in the error path coupled to the error amplifier that centers the correction bandwidth with respect to the amplified RF signal. The delay element introduces a first delay in the amplified RF signal that is smaller than a second delay caused by the error path.

Another embodiment provides a method for extending operation bandwidth of a power amplifier with fractional instantaneous bandwidth feed forward correction. The method includes amplifying, using a main amplifier, a radio frequency (RF) input signal to provide an amplified RF signal and introducing, using a delay element in a main path of a feed forward correction loop coupled to the main amplifier, a first delay in the amplified RF signal. The method also includes receiving, in an error path of the feed forward correction loop, an error signal of the amplified RF signal and centering, using a composite phase extender, a correction bandwidth with respect to the amplified RF signal. The method also includes amplifying, using an error amplifier, the error signal and combining, using a coupler, the amplified RF signal and the amplified error signal to reduce an error in the amplified RF signal. The first delay is smaller than a second delay caused by the error path.

Figure 3:
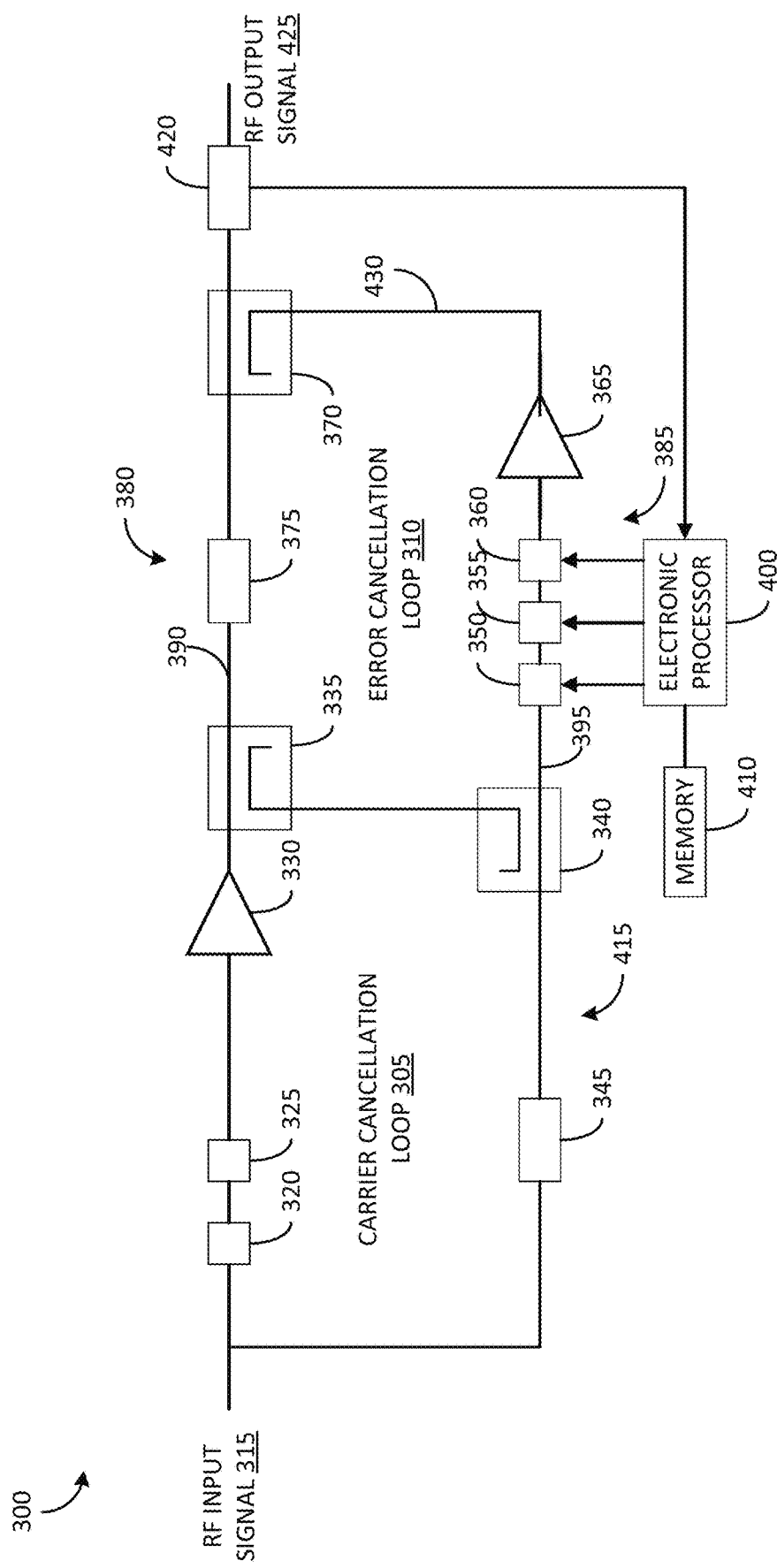
FIG. 3 is a simplified block diagram of a power amplifier in accordance with some embodiments.

FIG. 3 is a simplified block diagram of a power amplifier 300 in accordance with some embodiments. The power amplifier 300 includes a carrier cancellation loop 305 and an error cancellation loop 310. The carrier cancellation loop 305 and the error cancellation loop 310 are together referred to as a feed forward correction loop. The carrier cancellation loop 305 includes a radio frequency (RF) input signal 315, a carrier cancellation phase shifter 320, a carrier cancellation gain shifter 325, a main amplifier 330, a main path carrier cancellation coupler 335, a clean path carrier cancellation coupler 340, and a carrier cancellation delay 345. The error cancellation loop 310 includes the main path carrier cancellation coupler 335, the clean path carrier cancellation coupler 340, an error cancellation phase extender 350 (for example, a phase extender or a phase shifter with course adjustments), an error cancellation phase shifter 355 (for example, a phase shifter with fine adjustments), an error cancellation gain shifter 360 (for example, a gain shifter), an error amplifier 365, an error cancellation coupler 370, and a fractional delay element 375. The power amplifier 300 may include more or fewer components than those illustrated in FIG. 3 and may perform more or fewer functions than those described herein.

The main amplifier 330 receives RF input signal 315 and generates an amplified radio frequency (RF) signal 390 in an amplified main path 380 (for example, a main path) of the power amplifier 300. The phase and gain of the RF input signal 315 can be adjusted using the carrier cancellation phase shifter 320 and the carrier cancellation gain shifter 325 respectively. The clean path carrier cancellation coupler 340 receives the RF input signal 315 and the amplified RF signal 390 from the main path carrier cancellation coupler 335. The clean path carrier cancellation coupler 340 cancels or reduces the carrier signal from the amplified RF signal 390 and provides an error signal 395 including the distortion components with reduced carrier signal component on an error path 385 to the error amplifier 365. The carrier cancellation delay 345 is provided in the clean path 415 to match the delay in the amplified RF signal 390 caused by the main amplifier 330. The carrier cancellation delay 345 allows the RF input signal 315 and the amplified RF signal 390 to be provided via the main path carrier cancellation coupler 335 to the clean path carrier cancellation coupler 340 with minimal delay mismatch. In some embodiments, the RF input signal 315 and the amplified RF signal 390 are provided at substantially "180" degrees apart at the clean path carrier cancellation coupler 340.

The error amplifier 365 amplifies the error signal 395 to generate an amplified error signal 430 to the error cancellation coupler 370. The error cancellation coupler 370 couples the amplified error signal 430 out of phase by "180" degrees with the amplified RF signal 390 to cancel or reduce the distortions at an RF output signal 425. The phase and gain of the error signal 395 can be adjusted using the error cancellation phase shifter 355 and the error cancellation gain shifter 360 respectively. The fractional delay element 375 is provided in the amplified main path 380 to fractionally match the delay caused by the error amplifier 365 and other components in the error path 385 (for example, the main path carrier cancellation coupler 335, the clean path carrier cancellation coupler 340, the error cancellation phase shifter 355 and the error cancellation gain shifter 360). In some embodiments, the fractional delay element 375 is implemented using a coaxial cable. The coaxial cable can have reduced attenuation compared to other implementations of the fractional delay element 375. Additionally, in some embodiments, the coaxial cable can support a larger operational bandwidth for error cancellation, albeit a smaller instantaneous bandwidth, than a tuned delay filter. Accordingly, using a coaxial cable as the fractional delay element 375 can provide additional power savings and larger operational bandwidths to the power amplifier 300.

The error cancellation phase extender 350 and the error cancellation phase shifter 355 are together referred to as a composite phase shifter. The error cancellation phase extender 350 may be implemented as part of the error cancellation phase shifter 355 or as a separate component. In embodiments, where the error cancellation phase extender 350 is implemented as part of the error cancellation phase shifter 355, the composite phase shift range is configured to be greater than "360" degrees over the phase shift range provided by the error cancellation phase shifter 355, and in some embodiments, substantially greater than "360" degrees over the phase shift range provided by the error cancellation phase shifter 355. In one example, the error cancellation phase shifter 355 may provide a phase shift of "180" degrees to compensate for the power amplifier 300 in regards to build variation, part tolerances, operating temperature, aging, and the like of the power amplifier 300. The error cancellation phase extender 350 is controlled to apply a phase setting based on a center frequency of the operation frequency sub-band of the RF input signal 315. The phase setting allows the error cancellation phase shifter 355 to be substantially centered in its adjustment range at nominal operating temperatures, build variation, part tolerances, and the like of the power amplifier 300. Thus, the error cancellation phase extender 350 centers the error cancellation phase shifter 355 at the center frequency of the RF input signal 315. In some embodiments, the error cancellation phase shifter 355 and/or the composite phase shifter is constructed with quadrature reflection phase shifters. In some embodiments, the phase extender is implemented separately from the phase shifter and includes one or more delay line segments that can be switched in and out of the error cancellation loop 310 based on, for example, the center frequency of the operation frequency sub-band of the RF input signal 315.

When the power amplifier 300 is implemented in a radio frequency (RF) transmitter, the power amplifier 300 is controlled by an electronic processor 400. The electronic processor 400 is coupled to a memory 410 and an inter-modulation (IMD) power detector 420. The electronic processor 400 provides control signals to the error cancellation phase extender 350, the error cancellation phase shifter 355, and the error cancellation gain shifter 360 to provide the settings for the error cancellation phase extender 350, the error cancellation phase shifter 355, and the error cancellation gain shifter 360. The electronic processor 400 receives detection signals from the IMD power detector 420.

In some embodiments, the electronic processor 400 is implemented as a microprocessor with separate memory, for example, the memory 410. In other embodiments, the electronic processor 400 is implemented as a microcontroller or digital signal processor (with memory 410 on the same chip). In other embodiments, the electronic processor 400 is implemented using multiple processors. In addition, the electronic processor 400 may be implemented partially or entirely as, for example, a field-programmable gate array (FPGA), an application specific integrated circuit (ASIC), and the like and the memory 410 may not be needed or be modified accordingly. In the example illustrated, the memory 410 includes non-transitory, computer-readable memory that stores instructions that are received and executed by the electronic processor 400 to carry out the functionality described herein. The memory 410 may include, for example, a program storage area and a data storage area. The program storage area and the data storage area may include combinations of different types of memory, for example, read-only memory and random-access memory.

The memory 410 stores a look-up table including initial settings for each center frequency of the RF input signal 315. The look-up table includes initial settings for each of the error cancellation phase extender 350, the error cancellation phase shifter 355, and the error cancellation gain shifter 360. The initial settings are stored in the look-up table corresponding to a frequency sub-band of operation of the power amplifier 300. That is, the memory 410 stores a mapping between a plurality of frequency sub-bands and a plurality of phase settings. The electronic processor 400 determines the frequency sub-band of operation of the power amplifier 300, for example, by communicating with a multi-carrier scheduler of the RF transmitter where the power amplifier 300 is implemented. The electronic processor 400 uses the look-up table stored in the memory 410 to determine the initial settings for the error cancellation phase extender 350, the error cancellation phase shifter 355, and the error cancellation gain shifter 360 based on the determined frequency sub-band of operation of the power amplifier 300. The electronic processor 400 sets the error cancellation phase extender 350, the error cancellation phase shifter 355, and the error cancellation gain shifter 360 to the settings determined from the look-up table stored in the memory 410.

The IMD power detector 420 detects the average power of the distortion signals in the amplified RF signal 390. The IMD power detector 420 provides an indication of the average power of the distortion signals to the electronic processor 400. In some embodiments, the IMD power detector 420 detects the average power of pilot tones injected prior to the main path carrier cancellation coupler 335 to provide an indication of the average power of the distortion signal to the electronic processor 400. In some embodiments, the electronic processor 400 further adjusts the settings of the error cancellation phase extender 350, the error cancellation phase shifter 355, and the error cancellation gain shifter 360 to achieve the desired amount of correction (for example, "20" dB correction) in the amplified RF signal 390.

Figure 4:
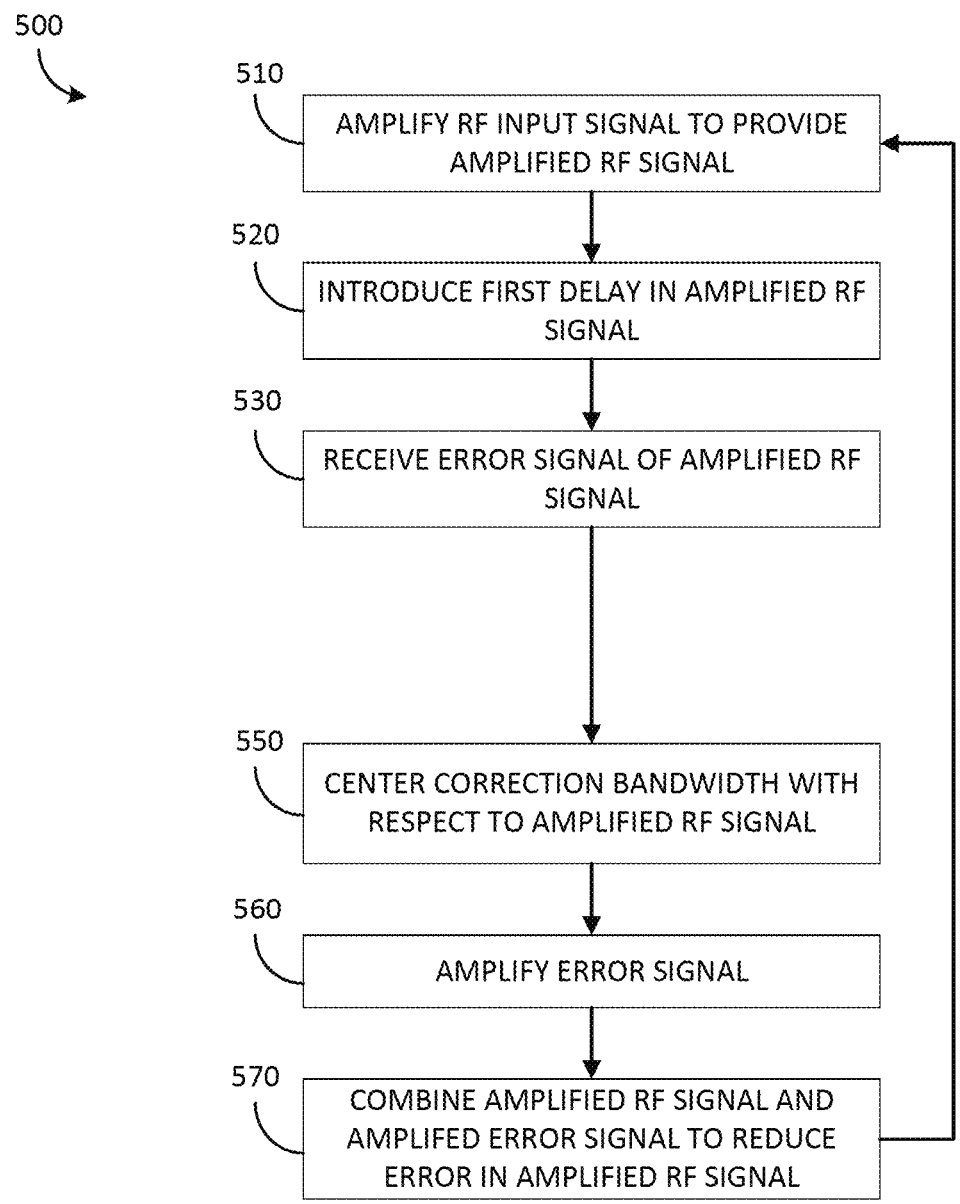
FIG. 4 is a method for extending operation bandwidth of the power amplifier of FIG. 3 in accordance with some embodiments.

FIG. 4 is a flowchart of an example method 500 for extending operation bandwidth of the power amplifier 300 with fractional instantaneous bandwidth feed forward correction. In the example illustrated, the method 500 includes amplifying, using the main amplifier 330, the RF input signal 315 to provide an amplified RF signal 390 (at block 510). The method 500 also includes introducing, using the fractional delay element 375 in the amplified main path 380 of the error cancellation loop 310 coupled to the main amplifier 330, a first delay in the amplified RF signal 390 (at block 520). The first delay is smaller than a second delay caused by the error path 385 of the error cancellation loop 310. In some embodiments, the first delay is less than 50% of the second delay. Due to the fractional delay match by the fractional delay element 375, the power amplifier 300 provides fractional instantaneous bandwidth feed forward correction in the RF output signal 425. That is, the correction bandwidth of the power amplifier 300 is a fraction of the correction bandwidth in a case where the fractional delay element 375 matched the delay in the error path 385.

The method 500 also includes receiving, in the error path 385 of the error cancellation loop 310, the error signal 395 of the amplified RF signal 390 (at block 530). The clean path carrier cancellation coupler 340 removes the carrier signal from the amplified RF signal 390 to isolate the error signal 395. The error signal 395 is then provided by the clean path carrier cancellation coupler 340 to the error amplifier 365 through the error cancellation phase extender 350, the error cancellation phase shifter 355, and the error cancellation gain shifter 360.

In some embodiments, the method 500 also includes phase shifting, using the error cancellation phase shifter 355, a phase of the error signal 395. The electronic processor 400 controls the error cancellation phase shifter 355 to change the phase of the error signal 395. To provide desired correction, the amplified error signal 430 "180" degrees out of phase from the amplified RF signal 390 is provided at the error cancellation coupler 370. The electronic processor 400 sets the initial phase and initial gain of the error signal 395 based on the look-up table.

The method 500 also includes centering, using the error cancellation phase extender 350 (for example, the composite phase shifter), the correction bandwidth with respect to the amplified RF signal 390 (at block 550). The electronic processor 400 controls the error cancellation phase extender 350 to center the instantaneous correction bandwidth of the error cancellation phase shifter 355 to the frequency sub-band of the amplified RF signal 390. To provide desired correction, the error cancellation phase shifter 355 is centered or substantially centered, using the error cancellation phase extender 350, within the frequency sub-band of the RF input signal 315.

In some embodiments, the composite phase shift range of the composite phase shifter is at least "540" degrees. In embodiments where the error cancellation phase extender 350 is implemented separate from the error cancellation phase shifter 355, the error cancellation phase extender 350 may chase the center frequency from the starting point to the ending point of the frequency sub-band. In other embodiments, where the error cancellation phase extender 350 is implemented as part of the error cancellation phase shifter 355, the composite phase shift range of the error path 385 is substantially greater than "540" degrees. That is, the error cancellation phase shifter 355 has contiguous steps to chase the center frequency of the frequency sub-band.

The method 500 includes amplifying, using the error amplifier 365, the error signal 395 (at block 560). The error amplifier 365 receives the phase shifted error signal 395 from the error cancellation phase shifter 355 and amplifies the error signal 395 before providing the amplified error signal 430 to the error cancellation coupler 370. The method 500 also includes combining, using the error cancellation coupler 370, the amplified RF signal 390 and the amplified error signal 430 to reduce an error in the amplified RF signal 390 (at block 570). The method 500 repeats for every instantiation of the RF transmitter including the power amplifier 300.

Figure 5:
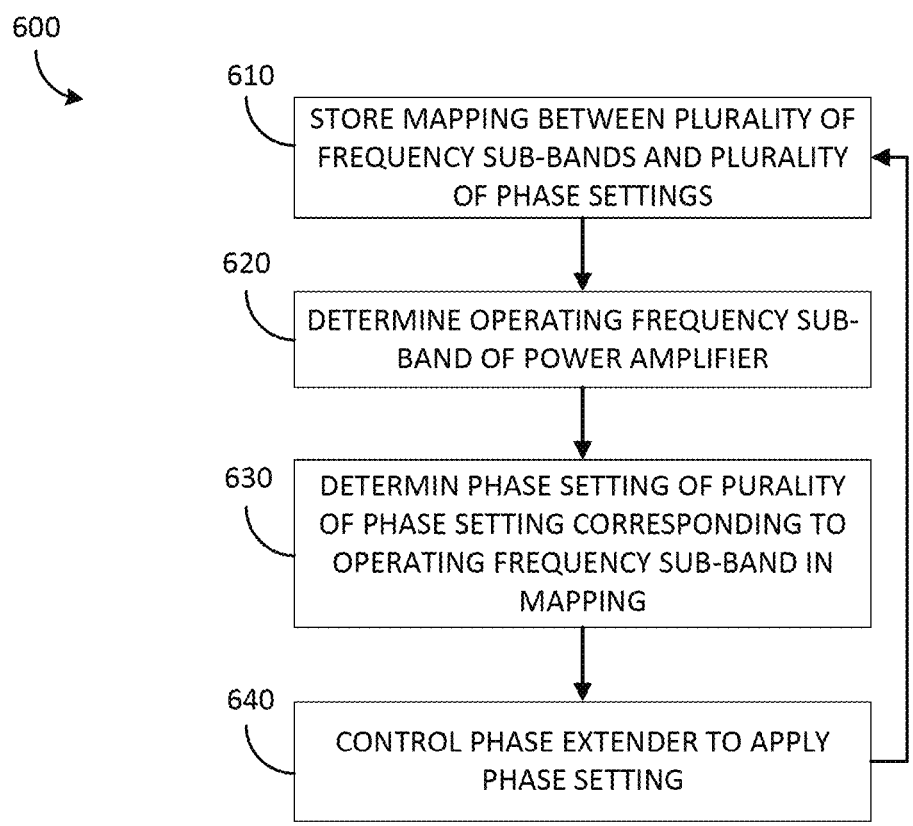
FIG. 5 is a method for extending operation bandwidth of the power amplifier of FIG. 3 in accordance with some embodiments.

FIG. 5 is a flowchart of an example method 600 for extending operation bandwidth of the power amplifier 300 with fractional instantaneous bandwidth feed forward correction. In the example illustrated, the method 600 includes storing, using the memory 410, a mapping between a plurality of frequency sub-bands and a plurality of phase settings (at block 610). As discussed above, the memory 410 stores a look-up table including the mapping between the plurality of frequency sub-bands and a plurality of initial settings for the error cancellation phase extender 350, the error cancellation phase shifter 355, and the error cancellation gain shifter 360. That is, the initial phase settings for the error cancellation phase extender 350 are included in the plurality of initial settings and correspond to the plurality of frequency sub-bands.

The method 600 also includes determining, using the electronic processor 400 coupled to the memory 410 and the feed forward correction loop, an operating frequency sub-band of the power amplifier 300 (at block 620). In some embodiments, the electronic processor 400 determines the operating frequency sub-band based on the initial configuration settings of the RF transmitter and the power amplifier 300. In some embodiments, the electronic processor 400 determines the frequency sub-band of operation of the power amplifier 300, for example, by communicating with a multi-carrier scheduler of the RF transmitter where the power amplifier 300 is implemented.

The method 600 also includes determining, using the electronic processor 400, a phase setting of the plurality of phase settings corresponding to the operating frequency sub-band in the mapping (at block 630). The electronic processor 400 refers to the look-up table stored in memory 410 to determine the phase setting associated with operating frequency sub-band of the power amplifier 300. For example, when the power amplifier 300 is operating with a center frequency of 390 MHz (for example, a sub-bandwidth surrounding the center frequency 390 MHz), the electronic processor 400 determines the phase setting associated with the center frequency 390 MHz. In some embodiments, the electronic processor 400 also determines the initial settings for the error cancellation phase shifter 355 and the error cancellation gain shifter 360 associated with the center frequency 390 MHz.

The method 600 also includes controlling, using the electronic processor 400, the error cancellation phase extender 350 to apply the phase setting (at block 640). The electronic processor 400 tunes the error cancellation phase extender 350 to the phase setting determined from the loo-up table. By tuning the error cancellation phase extender 350, the method 600 centers the correction bandwidth of the feed forward correction loop about the center frequency of the RF input signal 315. In some embodiments, the electronic processor 400 also tunes the error cancellation phase shifter 355 and the error cancellation gain shifter 360 based on the initial settings determined from the look-up table. The method 600 repeats for every instantiation of the RF transmitter including the power amplifier 300.

In some embodiments, the electronic processor 400 further tunes the error cancellation phase shifter 355 and the error cancellation gain shifter 360 based on the feedback received from the IMD power detector 420 to achieve the appropriate amount of correction in the RF output signal 425.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A power amplifier comprising:
   a main amplifier amplifying a radio frequency (RF) input signal to provide an amplified radio frequency (RF) signal;
   a feed forward correction loop coupled to the main amplifier for cancelling intermodulation distortion in the amplified RF signal, the feed forward correction loop including
      a delay element in a main path of the feed forward correction loop,
      an error amplifier in an error path, and
      a composite phase shifter in the error path coupled to the error amplifier that centers a correction bandwidth with respect to the amplified RF signal,
   wherein the delay element introduces a first delay in the amplified RF signal that is smaller than a second delay caused by the error path,
   wherein the composite phase shifter includes:
      a phase shifter in the error path of the feed forward correction loop; and
      a phase extender in the error path coupled to the phase shifter that centers the phase shifter with respect to the amplified RF signal to center the correction bandwidth with respect to the amplified RF signal;
   a memory storing a mapping between a plurality of frequency sub-bands and a plurality of phase settings; and
   an electronic processor coupled to the memory and the feed forward correction loop and configured to determine an operating frequency sub-band of the power amplifier;
determine a phase setting of the plurality of phase settings corresponding to the operating frequency sub-band; and
control the phase extender to apply the phase setting.

2. The power amplifier of claim 1, wherein a composite phase shift range of the composite phase shifter is at least 540 degrees.

3. The power amplifier of claim 1, wherein a composite phase shift range of the composite phase shifter is substantially greater than 540 degrees.

4. The power amplifier of claim 1, wherein the first delay is less than 50% of the second delay.

5. The power amplifier of claim 1, wherein the phase shifter includes quadrature reflection phase shifters and the phase extender includes delay line segments.

6. The power amplifier of claim 1, wherein the electronic processor is further configured to communicate with a multi-carrier scheduler of a radio frequency (RF) transmitter to determine the operating frequency sub-band of the power amplifier.

7. A method for extending operation bandwidth of a power amplifier with fractional instantaneous bandwidth feed forward correction, the method comprising:
amplifying, using a main amplifier, a radio frequency (RF) input signal to provide an amplified RF signal;
introducing, using a delay element in a main path of a feed forward correction loop coupled to the main amplifier, a first delay in the amplified RF signal;
receiving, in an error path of the feed forward correction loop, an error signal of the amplified RF signal;
centering, using a composite phase shifter, a correction bandwidth with respect to the amplified RF signal, wherein the composite phase shifter includes a phase shifter and a phase extender;
phase shifting, using the phase shifter, a phase of the error signal, wherein centering the correction bandwidth includes centering, using the phase extender, the phase shifter with respect to the amplified RF signal;
amplifying, using an error amplifier, the error signal;
combining, using a coupler, the amplified RF signal and the amplified error signal to reduce an error in the amplified RF signal,
wherein the first delay is smaller than a second delay caused by the error path;
storing, using a memory, a mapping between a plurality of frequency sub-bands and a plurality of phase settings; and
determining, using an electronic processor coupled to the memory and the feed forward correction loop, an operating frequency sub-band of the power amplifier;
determining, using the electronic processor, a phase setting of the plurality of phase settings corresponding to the operating frequency sub-band in the mapping; and
controlling, using the electronic processor, the phase extender to apply the phase setting.

8. The method of claim 7, wherein a composite phase shift range of the composite phase shifter is at least 540 degrees.

9. The method of claim 7, wherein a composite phase shift range of the composite phase shifter is substantially greater than 540 degrees.

10. The method of claim 7, wherein the first delay is less than 50% of the second delay.

11. The method of claim 7, wherein the phase shifter includes quadrature reflection phase shifters and the phase extender includes delay line segments.

12. The method of claim 7, further comprising communicating, using the electronic processor, with a multi-carrier scheduler of a radio frequency (RF) transmitter to determine the operating frequency sub-band of the power amplifier.

13. A power amplifier comprising:
a main amplifier amplifying a radio frequency (RF) input signal to provide an amplified radio frequency (RF) signal;
a feed forward correction loop coupled to the main amplifier for cancelling intermodulation distortion in the amplified RF signal, the feed forward correction loop including
a delay element in a main path of the feed forward correction loop,
an error amplifier in an error path, and
a composite phase shifter in the error path coupled to the error amplifier that centers a correction bandwidth with respect to the amplified RF signal,
wherein the delay element introduces a first delay in the amplified RF signal that is smaller than a second delay caused by the error path,
wherein the composite phase shifter includes:
a phase shifter in the error path of the feed forward correction loop; and
a phase extender in the error path coupled to the phase shifter that centers the phase shifter with respect to the amplified RF signal to center the correction bandwidth with respect to the amplified RF signal, wherein the phase shifter includes quadrature reflection phase shifters and the phase extender includes delay line segments.

14. A method for extending operation bandwidth of a power amplifier with fractional instantaneous bandwidth feed forward correction, the method comprising:
amplifying, using a main amplifier, a radio frequency (RF) input signal to provide an amplified RF signal;
introducing, using a delay element in a main path of a feed forward correction loop coupled to the main amplifier, a first delay in the amplified RF signal;
receiving, in an error path of the feed forward correction loop, an error signal of the amplified RF signal;
centering, using a composite phase shifter, a correction bandwidth with respect to the amplified RF signal, wherein the composite phase shifter includes a phase shifter and a phase extender;
phase shifting, using the phase shifter, a phase of the error signal, wherein centering the correction bandwidth includes centering, using the phase extender, the phase shifter with respect to the amplified RF signal, wherein the phase shifter includes quadrature reflection phase shifters and the phase extender includes delay line segments;
amplifying, using an error amplifier, the error signal; and
combining, using a coupler, the amplified RF signal and the amplified error signal to reduce an error in the amplified RF signal,
wherein the first delay is smaller than a second delay caused by the error path.

* * * * *